US009562171B2

(12) United States Patent
Gaska et al.

(10) Patent No.: US 9,562,171 B2
(45) Date of Patent: Feb. 7, 2017

(54) ULTRAVIOLET DEVICE ENCAPSULANT (71) Applicant: Sensor Electronic Technology, Inc., Columbia, SC (US)

(72) Inventors: Remigijus Gaska, Columbia, SC (US); Maxim S. Shatalov, Columbia, SC (US); Alexander Dobrinsky, Providence, RI (US); Jinwei Yang, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 1031 days.

(21) Appl. No.: 13/624,162

(22) Filed: Sep. 21, 2012

(65) Prior Publication Data
US 2013/0078411 A1    Mar. 28, 2013

Related U.S. Application Data (60) Provisional application No. 61/538,115, filed on Sep. 22, 2011.

(51) Int. Cl.
*C09D 163/00* (2006.01)
*C09K 11/02* (2006.01)
*H01L 33/56* (2010.01)

(52) U.S. Cl.
CPC ............ *C09D 163/00* (2013.01); *C09K 11/02* (2013.01); *H01L 33/56* (2013.01); *Y10T 428/23* (2015.01)

(58) Field of Classification Search
CPC ...... C09D 163/00; Y10T 428/23; H01L 33/56; C09K 11/02
USPC .......................... 428/168, 220; 106/401, 481
See application file for complete search history.

(56) References Cited

U.S. PATENT DOCUMENTS

| | | |
|---|---|---|
| 2,433,928 A | 1/1948 | Sheldon |
| 3,994,708 A | 11/1976 | von Reth et al. |
| 4,792,535 A | 12/1988 | Fine |
| 4,925,814 A | 5/1990 | Fine |
| 4,973,565 A | 11/1990 | Fine |
| 5,045,509 A | 9/1991 | Kiefer |
| 5,547,904 A | 8/1996 | Watzke et al. |
| 5,610,108 A | 3/1997 | Watzke et al. |
| 6,252,221 B1* | 6/2001 | Kaneko ................. B82Y 20/00 250/214 LA |
| 6,921,929 B2 | 7/2005 | LeBoeuf et al. |
| 7,304,326 B2 | 12/2007 | Suehiro et al. |
| 7,358,206 B2 | 4/2008 | Cornelius et al. |
| 7,838,452 B2 | 11/2010 | Kurachi et al. |
| 2006/0035469 A1* | 2/2006 | Truong ............... H01L 27/3246 438/739 |
| 2006/0084742 A1* | 4/2006 | Ishida ..................... C08L 9/02 524/425 |
| 2007/0182323 A1 | 8/2007 | Ogata et al. |
| 2008/0031009 A1 | 2/2008 | Kodaira et al. |
| 2008/0099759 A1* | 5/2008 | Fujii ................... H01L 51/0022 257/40 |
| 2008/0308825 A1 | 12/2008 | Chakraborty et al. |
| 2010/0244286 A1 | 9/2010 | Lagsa |

FOREIGN PATENT DOCUMENTS

| | | |
|---|---|---|
| KR | 10-2011-0068867 A | 6/2011 |
| KR | 20110068867 | 6/2011 |

OTHER PUBLICATIONS

Wong, C. P., Thermal-Mechanical Enhanced High-Performance Silicone Gels and Elastomeric Encapsulants in Microelectronic Packaging, IEEE Transactions on Components, Packaging, and Manufacturing Technology, Jun. 1995, pp. 270-273, vol. 18.

Zhou et al., Epoxy-based Optically Transparent Nanocomposites for Photonic Packaging, 9th Int'l Symposium on Advanced Packaging Materials, 2004, pp. 100-102.

Sergo et al., Thermal expansion and percolation in a SIC whisker-reinforced ceramic composite, Journal of Materials Science Letters, 1991, pp. 855-857, Chapman and Hall Ltd.

Park, International Search Report and Written Opinion for International Application No. PCT/US2012/056768, Mar. 15, 2013, 11 pages.

Park, International Application No. PCT/US2012/056768, International Search Report and the Written opinion of the International Searching Authority, Mar. 15, 2013, 11 pages.

* cited by examiner

*Primary Examiner* — Aaron Austin
*Assistant Examiner* — Lawrence Ferguson
(74) *Attorney, Agent, or Firm* — LaBatt, LLC (57) ABSTRACT A composite material, which can be used as an encapsulant for an ultraviolet device, is provided. The composite material includes a matrix material and at least one filler material incorporated in the matrix material that are both at least partially transparent to ultraviolet radiation of a target wavelength. The filler material includes microparticles and/or nanoparticles and can have a thermal coefficient of expansion significantly smaller than a thermal coefficient of expansion of the matrix material for relevant atmospheric conditions. The relevant atmospheric conditions can include a temperature and a pressure present during each of: a curing and a cool down process for fabrication of a device package including the composite material and normal operation of the ultraviolet device within the device package.

16 Claims, 10 Drawing Sheets

ULTRAVIOLET DEVICE ENCAPSULANT

REFERENCE TO RELATED APPLICATIONS

The current application claims the benefit of U.S. Provisional Application No. 61/538,115, titled "Ultraviolet Light Emitting Diode Encapsulant," which was filed on 22 Sep. 2011, and which is hereby incorporated by reference.

GOVERNMENT LICENSE RIGHTS

This invention was made with Federal government support under Contract No. W911NF-10-2-0023 awarded by Defense Advanced Research Projects Agency (DARPA). The government has certain rights in the invention.

TECHNICAL FIELD

The disclosure relates generally to ultraviolet light emitting devices, and more particularly, to an encapsulant for ultraviolet light emitting devices.

BACKGROUND ART

With recent advances in group III-based ultraviolet (UV) light emitting diode (LED) technology, interest in using UV LEDs for various applications, such as disinfection of medical tools, water purification, fluorescence spectroscopy, medical therapy, and the like, is increasing. Despite tremendous efforts, UV LEDs continue to suffer from relatively low external quantum efficiencies. Improvement in light extraction from the UV LED structure can increase the overall efficiency of a device. One approach for improving light extraction uses an index matching encapsulant (e.g., similar to the approach used for visible LEDs) in order to decrease the total internal reflection (TIR) from the device surfaces and, as a result, extract more light from the UV LED.

Typical epoxy resin materials used for visible LED encapsulation are not adequate for UV LEDs as the resins are not sufficiently transparent to UV radiation and quickly deteriorate under the UV radiation. An ideal encapsulant should be "stable." In particular, the optical and physical properties of the encapsulant should not change during packaging, LED assembly, and during the operating lifetime of the LED. For example, an encapsulant should be resistant to heating during the LED assembly, such as during soldering a chip onto a printed circuit board or during a curing process. During the curing process, drying of the encapsulant can further induce stresses in the material. As a result, an encapsulant that is not prone to crack during the curing procedure can be selected.

A thermal coefficient of expansion (TCE) of the encapsulant can be chosen to match the TCE of an LED package in order to reduce stresses during temperature cycling, which can occur during the manufacture and operation of the LED. One approach to control TCE is by designing a composite material having the desired thermal characteristics. For example, epoxy-based optically transparent nano-composites have been studied for photonic packaging, and the effect the particle fraction of a silica filler has on the thermal coefficient of expansion of the composite material has been analyzed. TCE also has been investigated with respect to the effect of percolation in a silicon carbide (SiC) whisker reinforced ceramic composite. The effects of silica filler on the mechanical properties of a composite encapsulant have also been investigated.

SUMMARY OF THE INVENTION

Aspects of the invention provide a composite material, which can be used as an encapsulant for an ultraviolet device. The composite material includes a matrix material and at least one filler material incorporated in the matrix material that are both at least partially transparent to ultraviolet radiation of a target wavelength. The filler material includes microparticles and/or nanoparticles and can have a thermal coefficient of expansion significantly smaller than a thermal coefficient of expansion of the matrix material for relevant atmospheric conditions. The relevant atmospheric conditions can include a temperature and a pressure present during each of: a curing and a cool down process for fabrication of a device package including the composite material and normal operation of the ultraviolet device within the device package.

A first aspect of the invention provides a composite material comprising: a matrix material at least partially transparent to ultraviolet radiation of a target wavelength and having a matrix material thermal coefficient of expansion; and at least one filler material at least partially transparent to the ultraviolet radiation incorporated in the matrix material, wherein the at least one filler material includes at least one of: microparticles or nanoparticles.

A second aspect of the invention provides a device package comprising: an ultraviolet device; and an encapsulant located adjacent to at least one surface of the ultraviolet device, wherein the encapsulant is a composite material including: a matrix material at least partially transparent to ultraviolet radiation of a target wavelength and having a matrix material thermal coefficient of expansion; and at least one filler material at least partially transparent to the ultraviolet radiation incorporated in the matrix material, wherein the at least one filler material includes at least one of: microparticles or nanoparticles.

A third aspect of the invention provides a device package comprising: an ultraviolet device; and an encapsulant located adjacent to at least one surface of the ultraviolet device, wherein the encapsulant is a composite material including: a matrix material at least partially transparent to ultraviolet radiation of a target wavelength and having a matrix material thermal coefficient of expansion; a first filler material at least partially transparent to the ultraviolet radiation incorporated in the matrix material, wherein the first filler material includes at least one of: microparticles or nanoparticles and has a filler thermal coefficient of expansion significantly smaller than the matrix material thermal coefficient of expansion for relevant atmospheric conditions; and a second filler material including a plurality of fluorescent particles incorporated in the matrix material, wherein the plurality of fluorescent particles are visibly fluorescent under exposure to the ultraviolet radiation.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a composite material, which can be used as an encapsulant for an ultraviolet device. The composite material includes a matrix material and at least one filler material incorporated in the matrix material that are both at least partially transparent to ultraviolet radiation of a target wavelength. The filler material includes microparticles and/or nanoparticles and can have a thermal coefficient of expansion significantly smaller than a thermal coefficient of expansion of the matrix material for relevant atmospheric conditions. The relevant atmospheric conditions can include a temperature and a pressure present during each of: a curing and a cool down process for fabrication of a device package including the composite material and normal operation of the ultraviolet device within the device package.

As used herein, a material is at least partially transparent when the material allows at least a portion of electromagnetic radiation in a corresponding a target radiation wavelength to pass there through. For example, a layer can be configured to be at least partially transparent to a target wavelength corresponding to a range of radiation wavelengths defined by a peak emission wavelength for an ultraviolet device+/−0 five nanometers. As used herein, a layer is at least partially transparent to radiation if it allows more than approximately 0.5 percent of the radiation to pass there through. In a more particular embodiment, an at least partially transparent layer is configured to allow more than approximately five percent of the radiation to pass there through. In a still more particular embodiment, an at least partially transparent layer is configured to allow more than approximately ten percent of the radiation to pass there through. Furthermore, as used herein, unless otherwise noted, the term "set" means one or more (i.e., at least one) and the phrase "any solution" means any now known or later developed solution.

Figure 1A:
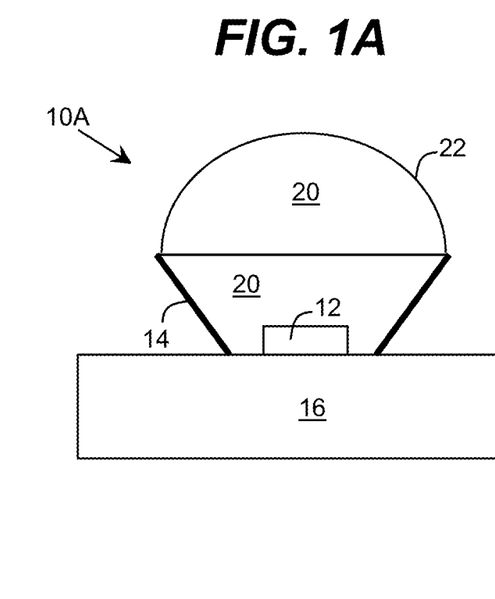
FIGS. 1A and 1B show schematics of illustrative ultraviolet device packages according to embodiments.
Figure 1B:
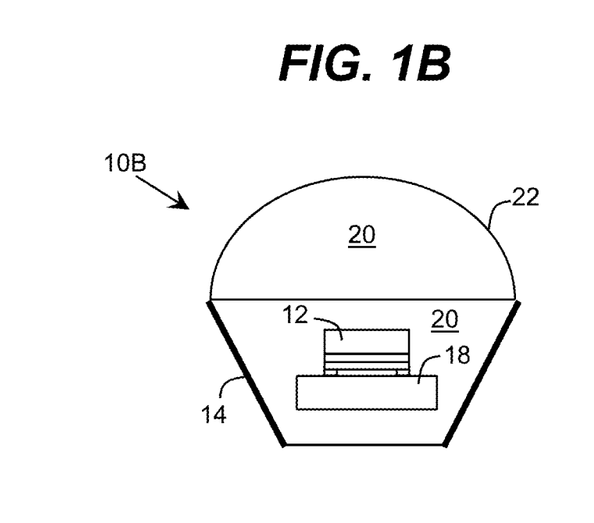

Turning to the drawings, FIGS. 1A and 1B show schematics of illustrative ultraviolet device packages 10A, 10B, respectively, according to embodiments. In FIG. 1A, the device package 10A includes an ultraviolet device 12 located within an enclosure 14, both of which are located on a heat sink 16. In FIG. 1B, the device package 10B includes an ultraviolet device 12 located on a submount 18, both of which are located within the enclosure 14. However, it is understood that these configurations are only illustrative of various configurations for device packages 10A, 10B.

Regardless, the ultraviolet device 12 can comprise any type of unitary device or circuit, the operation of which involves ultraviolet radiation. For example, the ultraviolet device 12 can comprise any type of device which when operated, generates, manipulates, detects, is effected by, and/or the like, ultraviolet radiation having a target wavelength. Illustrative ultraviolet devices 12 include, for example, an ultraviolet light emitting diode (LED), an ultraviolet laser, an ultraviolet photodetector, an ultraviolet photodiode, an ultraviolet phototransistor, an avalanche ultraviolet photodiode, an ultraviolet photomultiplier, and/or the like. Furthermore, an ultraviolet device 12 can comprise a circuit, such as an integrated circuit implemented on a chip, a die, and/or the like, which includes one or more unitary ultraviolet devices as circuit components. The target wavelength of the ultraviolet radiation can comprise the entire ultraviolet radiation spectrum or any subset of the ultraviolet radiation spectrum. In an embodiment, the target wavelength of the ultraviolet radiation is in a range of wavelengths between approximately 260 nanometers and approximately 360 nanometers.

The enclosure 14 can comprise any type of enclosure. For example, the enclosure 14 can be configured to provide a protective covering for the ultraviolet device 12. Furthermore, the enclosure 14 can be configured to direct ultraviolet radiation onto and/or away from the ultraviolet device 12. To this extent, as illustrated, the enclosure 14 can have a conical shape. Furthermore, the enclosure 14 can have an interior surface that is at least partially reflective of ultraviolet radiation having a target wavelength. In an embodiment, the enclosure 14 is formed of a material having a low absorption coefficient, such that a product of the absorption coefficient and the largest dimension of the enclosure 14 is significantly smaller than unity. Furthermore, an index of refraction of the enclosure 14 material can be smaller than an index of refraction of sapphire. For example, an index of refraction of the enclosure can be approximately equal to a square root of the index of refraction of sapphire. The heat sink 16 and submount 18 each can comprise any type of suitable material. For example, the heat sink 16 can be formed of a material having a high thermal conductivity, such as metal, while the submount 18 can be formed of a material which provides heat spreading, such as silicon carbide, diamond, or the like.

Each device package 10A, 10B further includes an encapsulant 20, which is at least partially transparent to ultraviolet radiation having a target wavelength. As illustrated, the encapsulant 20 can fill substantially all of the area formed by the enclosure 14. Furthermore, as illustrated in the device package 10B, the encapsulant 20 can enclose the entire ultraviolet device 12. However, it is understood that the encapsulant 20 can enclose only a portion of the ultraviolet device 12. For example, the encapsulant 20 can be located on a surface of the ultraviolet device 12, such as an emitting face or underfill of the ultraviolet device 12, through which ultraviolet radiation of the target wavelength is intended to pass (into or out of the ultraviolet device 12) during operation of the ultraviolet device 12. Additionally, the encapsulant 20 can have a curved outer surface 22, which can act as a lens for the ultraviolet radiation.

The encapsulant 20 comprises a composite material. In an embodiment, the composite material includes a matrix material and at least one filler material incorporated in the matrix material. The at least one filler material can be multiple particles, which can act as a skeleton for the encapsulant 20. The matrix material and/or filler material(s) can be selected and/or configured to provide one or more target attributes for the encapsulant 20. For example, the matrix and/or filler material(s) of the encapsulant 20 can be index-matched ultraviolet transparent materials, which can provide improved ultraviolet radiation extraction from or passage to the ultraviolet device 12. Furthermore, the matrix and/or filler material(s) of the encapsulant 20 can provide an adhesive (e.g., gluing) agent for the device packages 10A, 10B that is thermally and mechanically stable, thereby improving an operating lifetime for the ultraviolet device 12. The matrix and/or filler materials also can be selected and/or configured to improve thermal management of the ultraviolet device 12 during its operation. Additionally, the matrix and/or filler material(s) of the encapsulant 20 can have a thermal coefficient of expansion that is admissible for the fabrication of the device packages 10A, 10B as well as subsequent operation of the ultraviolet device 12 within the device package 10A, 10B.

The encapsulant 20 also can be configured to adjust one or more properties of the ultraviolet radiation passing through the encapsulant 20. To this extent, the filler material(s) can be selected and/or located within the matrix material to, for example, control an angular distribution of emitted ultraviolet radiation, control diffusive scattering, control an index of refraction, and/or the like. The matrix and/or filler materials also can provide an encapsulant 20 in which both diffusive scattering and refractive index change abruptly and/or smoothly throughout the encapsulant 20. In an embodiment, the encapsulant 20 can include filler material particles for subsequent light conversion. In a further embodiment, the filler material particles are formed of a material having a low absorption coefficient, such that a product of the absorption coefficient and the largest dimension of the filler material particles is significantly smaller than unity. Additionally, the encapsulant 20 can be configured to serve as an indicator of ultraviolet operational conditions of the ultraviolet device 12. For example, the matrix and/or filler materials can include a fluorescent material, which is fluorescent in the visible range under exposure to ultraviolet radiation.

The filler material(s) can be selected to adjust one or more electrical and/or mechanical properties for the encapsulant 20 so that the encapsulant 20 is suitable for various requirements including, for example, fabrication of the device packages 10A, 10B, operation of the ultraviolet device 12 within the device package 10A, 10B, and/or the like. For example, the filler material(s) can be selected to: reduce (e.g., minimize) thermal expansion of the encapsulant 20; increase (e.g., maximize) ultraviolet transparent properties of the encapsulant 20; control an effective refractive index of the encapsulant 20; and/or the like. The encapsulant 20 can include any concentration of the filler material(s). In an embodiment, a concentration of a filler material in the volume of the encapsulant 20 is greater than or equal to a percolation threshold.

In an embodiment, both the matrix material and the filler material(s) are at least partially transparent to ultraviolet radiation of a target wavelength for the ultraviolet device 12. Additionally, a refractive index of the matrix material can closely match a refractive index of one or more of the filler material(s). For example, a difference in the refractive indexes of the matrix material and at least one filler material can be less than or equal to approximately ten percent of the higher refractive index. However, the materials can have thermal coefficients of expansion that differ substantially in relevant atmospheric conditions (e.g., temperature, pressure, and/or the like). For example, the relevant atmospheric conditions can include atmospheric conditions present during a curing and/or a cool down process for fabrication of a device package 10A, 10B, during normal operation of the ultraviolet device 12, and/or the like. In an embodiment, a thermal coefficient of expansion for the filler material is significantly smaller (i.e., at least approximately three to seven (e.g., five) times smaller) than a thermal coefficient of expansion for the matrix material for the relevant atmospheric conditions. In a more particular embodiment, a thermal coefficient of expansion for the filler material is at least an order of magnitude smaller than a thermal coefficient of expansion for the matrix material for the relevant atmospheric conditions.

The various matrix materials and filler materials described herein can comprise any type of suitable materials. In an embodiment, the matrix material comprises a bonding material that is at least partially transparent to ultraviolet radiation having a target wavelength (e.g., between 260 and 360 nanometers). In a more particular embodiment, the matrix material of a thickness of approximately one millimeter has a transparency of at least approximately eighty percent for ultraviolet radiation having a wavelength in a range between approximately 260 nanometers and approximately 360 nanometers. Illustrative at least partially ultraviolet transparent bonding materials for the matrix material include a sol-gel, silicone, an amorphous fluoropolymer, an epoxy, and/or the like. Illustrative at least partially ultraviolet transparent materials for the filler materials include nanoparticles and/or microparticles formed of alumina sol-gel glass, alumina aerogel, sapphire, aluminum nitride (e.g., single crystal aluminum nitride), boron nitride (e.g., single crystal boron nitride), fused silica, and/or the like.

FIGS. 2A-2D show illustrative encapsulants 20A-20D, respectively, according to embodiments. Each encapsulant 20A-20D is a composite material including a matrix material 24 and at least one filler material 26. The filler material 26 can be composed of large and/or small (e.g., as compared to the size of the ultraviolet device 12) domains. An illustrative large domain can be, for example, a lens mounted onto the device package 10A, 10B (FIGS. 1A, 1B). Regardless, the matrix material can act as a glue between two or more filler material 26 domains. Each filler material 26 comprises a set of particles. The particles can include microparticles (e.g., between approximately 0.1 and approximately 100 microns in size) and/or nanoparticles (e.g., between approximately 1 and approximately 100 nanometers in size). In an embodiment, the particles are spheres (e.g., microspheres and/or nanospheres). However, it is understood that the filler material 26 can include particles of any shape and/or size. In an embodiment, a filler material 26 comprises filler particles having sizes smaller than a target wavelength of the ultraviolet radiation passing through the corresponding encapsulant 20A-20D (e.g., a wavelength of the ultraviolet radiation emitted by the ultraviolet device 12).

Figure 2A:
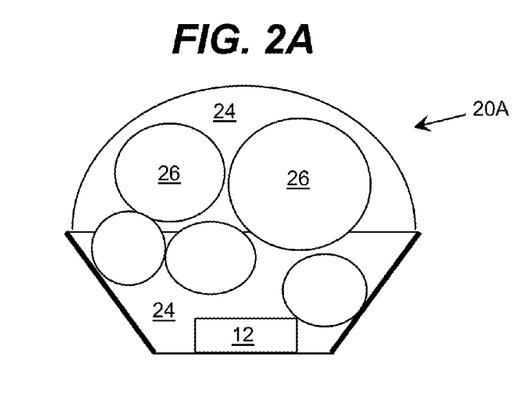
FIGS. 2A-2D show illustrative encapsulants including spherical filler material according to embodiments.
Figure 2B:
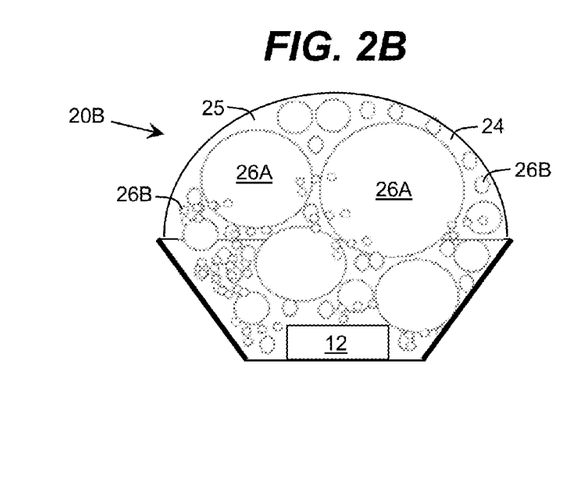

In FIG. 2A, the encapsulant 20A includes filler material 26 composed of a plurality of particles (e.g., microspheres), each of which forms a large domain of the filler material 26. Furthermore, the particles of the filler material 26 are held in place by the matrix material 24, which can act as a glue. In FIG. 2B, the encapsulant 20B includes multiple filler materials 26A, 26B. In this case, a first filler material 26A can comprise microparticles, which can form large domains, while a second filler material 26B can comprise a plurality of nanoparticles (e.g., nanospheres), which can form much smaller domains. In an embodiment, the matrix material 24 itself comprises a composite material. In particular, the matrix material 24 can include the second filler material 26B embedded within a bonding (glue) material 25, which can act as a glue for both filler materials 26A, 26B. However, it is understood that the matrix material 24 also can include the bonding material 25, without a filler material 26B, which can be incorporated into the matrix material 24 along with the first filler material 26A.

It is understood that the filler materials 26A, 26B can be the same or different types of material. For example, the filler material 26B, which can be part of the matrix material 24, can be fluorescent particles. The filler material 26B can be selected to identify a wavelength of the radiation emitted by the ultraviolet device 12, e.g., by having one or more visibly different attributes (e.g., a change in color) based on the wavelength of the ultraviolet radiation. In this case, the filler material 26B can comprise, for example, phosphors (e.g., such as those used in white light emitting diodes), semiconductor quantum dot having a band gap smaller than the radiation emitted by the ultraviolet device 12 (e.g., in visible wavelengths), and/or the like.

In an embodiment, the encapsulant 20B includes a volume concentration of the filler materials 26A, 26B, which exceeds a percolation threshold for the filler materials 26A, 26B. As the filler materials 26A, 26B may have different percolation thresholds, the concentrations of the corresponding filler materials 26A, 26B may be different for filler materials 26A, 26B within the encapsulant 20B and the bonding material 25. For example, the encapsulant 20B can have a concentration of particles of one or both filler materials 26A, 26B exceeding a three dimensional percolation threshold, while the bonding material 25 can include a concentration of particles that is equal to or exceeds a two dimensional percolation threshold.

Figure 2C:
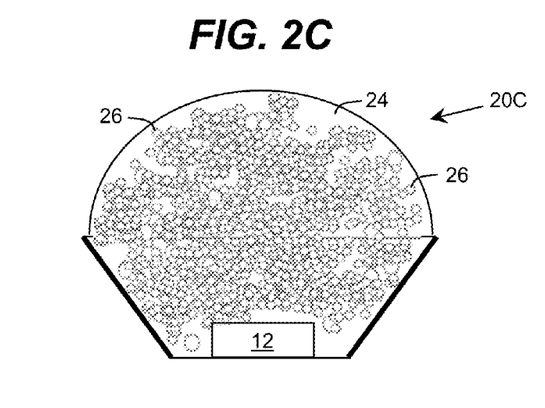

FIG. 2C illustrates an embodiment of the encapsulant 20C in which the filler material 26 comprises a plurality of nanoparticles, which can be distributed non-uniformly throughout the matrix material 24. The non-uniformity of the filler material 26 can form an encapsulant 20C having a concentration gradient for the filler material 26, in which different regions of the encapsulant 20C have different concentrations of the filler material 26. In this case, the varied concentration of the filler material 26 can be configured to produce a graded refractive index for the encapsulant 20C. The grading can result in a refractive index changing smoothly from a refractive index of the matrix material 24 to a refractive index of either ambient or the materials of the ultraviolet device 12 encapsulated by the encapsulant 20C.

Figure 2D:
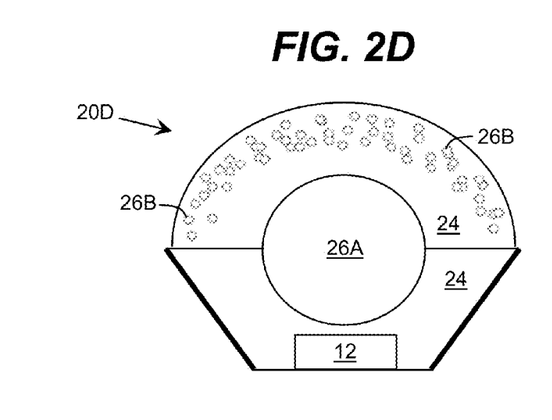

FIG. 2D illustrates an embodiment of the encapsulant 20D including a matrix material 24 and two types of the filler material 26A, 26B. In this case, a first type of the filler material 26A is shown comprising a single large domain that is centrally located with respect to the ultraviolet device 12, while the second type of the filler material 26B is shown having a distribution within the composite material 20D that varies with respect to a distance from a surface of the ultraviolet device 12 to an external surface of the encapsulant 20D. In an embodiment, a spatial distribution of the filler material 26B can be configured to provide wave guiding for the ultraviolet radiation passing through the encapsulant 20D. For example, the spatial distribution of the filler material 26B can be radially symmetric.

Figure 3:
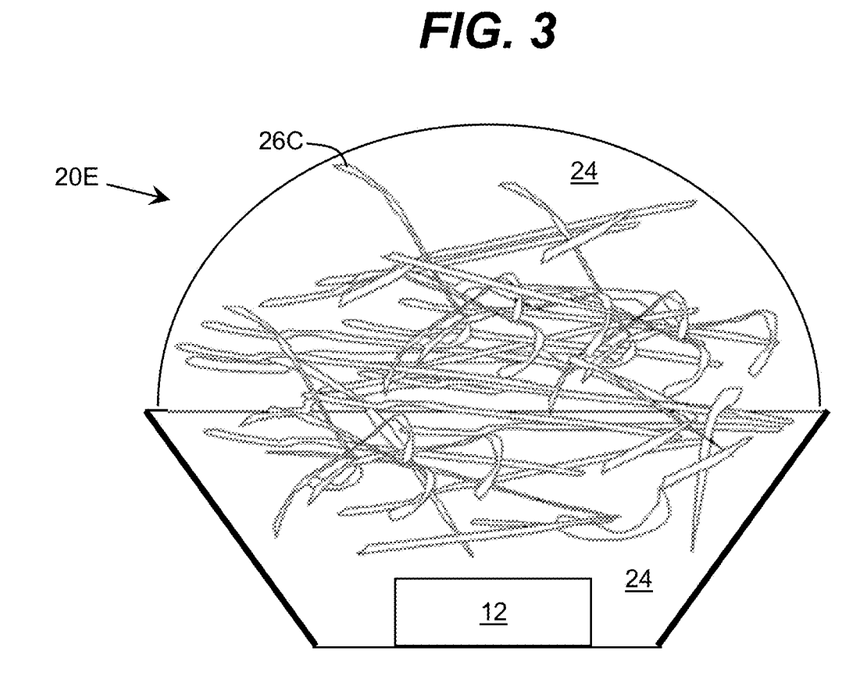
FIG. 3 shows an illustrative encapsulant including elongate filler material according to an embodiment.

As discussed herein, it is understood that the filler material 26 can comprise a set of particles of any shape. To this extent, FIG. 3 shows an illustrative encapsulant 20E including elongate particles of filler material 26C according to an embodiment. In this case, the filler material 26C comprises a plurality of particles (e.g., whiskers), each of which has a high aspect ratio (e.g., ten to one or greater). Furthermore, the filler material 26C can have a thermal coefficient of expansion that is significantly lower than that of the matrix material 24. As illustrated, the filler material 26C can be distributed in a random manner, e.g., with varying concentrations, orientations, and/or the like, throughout the encapsulant 20E.

Figure 4:
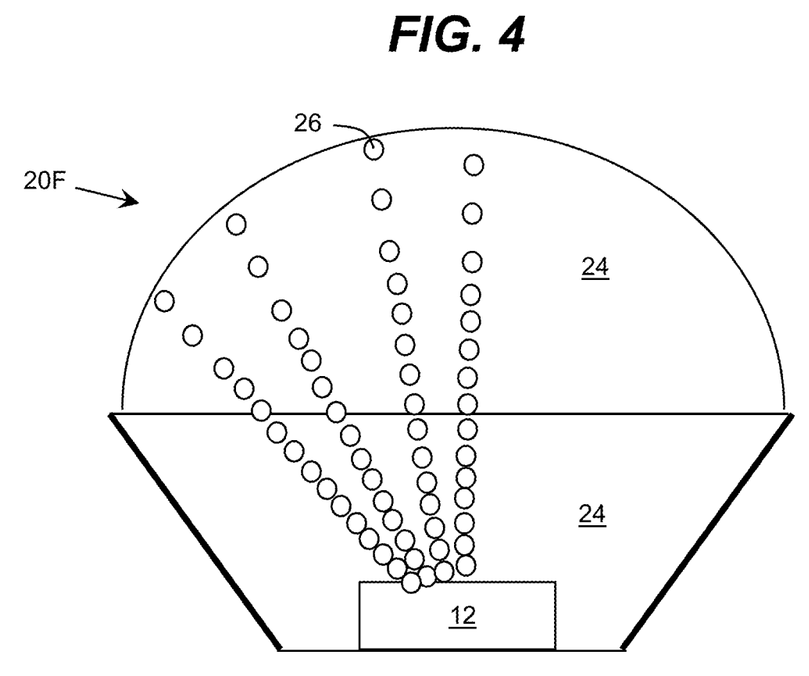
FIG. 4 shows an illustrative encapsulant having a radially non-uniform distribution of the filler material according to an embodiment.

FIG. 4 shows an illustrative encapsulant 20F having a radially non-uniform distribution of the filler material 26 according to an embodiment. As illustrated, the filler material 26 can be configured to provide a plurality of paths from the ultraviolet device 12 to an external surface of the encapsulant 20F. The plurality of paths can be used, for example, to control thermal and/or optical properties of the encapsulant 20F. Furthermore, the filler material 26 is shown having a non-uniform distribution over a distance from the surface of the ultraviolet device 12 to an external surface of the encapsulant 20F.

Figure 5:
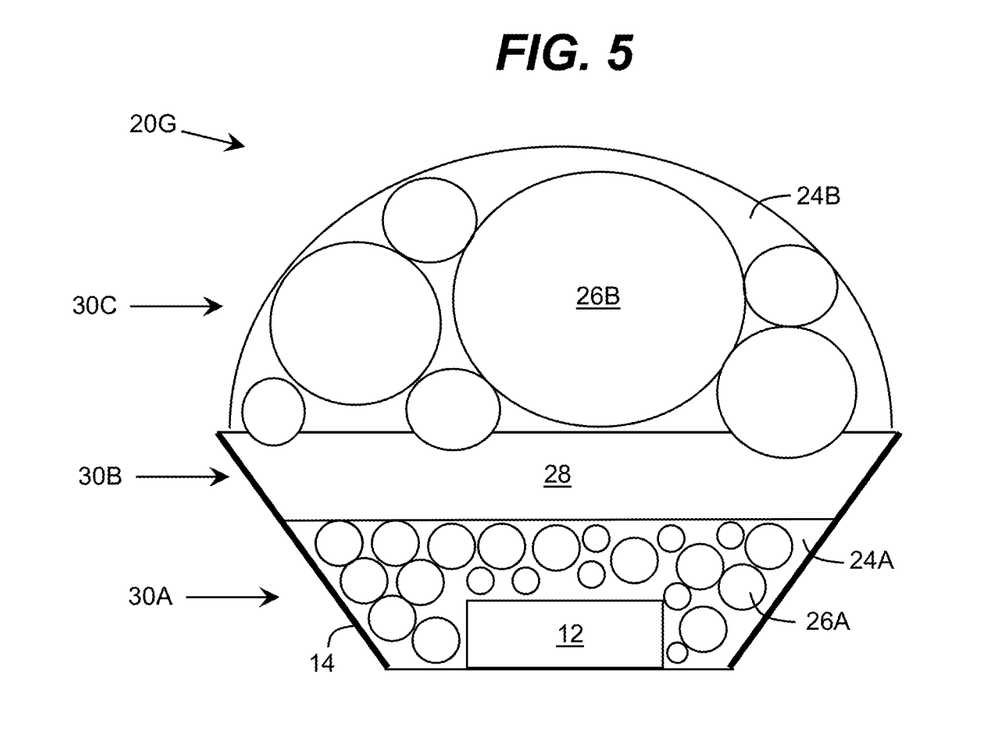
FIG. 5 shows an illustrative encapsulant including a plurality of layers according to an embodiment.

FIG. 5 shows an illustrative encapsulant 20G including a plurality of layers 30A-30C according to an embodiment. In particular, adjacent to the ultraviolet device 12, the encapsulant 20G can comprise a first matrix material 24A with a first filler material 26A embedded therein. Additionally, the encapsulant 20G can comprise a second matrix material 24B with a second filler material 26B embedded therein. The encapsulant 20G can include a layer 30B of a bonding (e.g., adhesive) material 28, which can adhere the two layers 30A, 30C of composite materials to one another. As illustrated, the layer 30C can be shaped as a lens and be attached to the enclosure 14 using the adhesive material 28. It is understood that each layer of composite material, such as the layers 30A, 30C, can have a composition that is independent of the composition of the other layer(s). To this extent, the first and second matrix materials 24A, 24B and/or the first and second filler materials 26A, 26B can comprise the same materials or different materials. Furthermore, the bonding material 28 can comprise the same or a different bonding material as either or both of the matrix materials 24A, 24B.

In an embodiment, the layer 30A can provide a transitional layer from the ultraviolet device 12 to the other layers 30B, 30C of the encapsulant 20G. For example, the layer 30A can be formed of an at least partially ultraviolet transparent material that is amenable to welding to a material of the enclosure 14, the ultraviolet device 12, a submount 18 (FIG. 1B), and/or the like. In a more particular embodiment, the layer 30A includes metal alloys, which can be, for example, molybdenum, or the like. Regardless, in an embodiment, a refractive index for each of the layers 30A-30C can closely match (e.g., within approximately ten percent of the higher refractive index) a refractive index for the adjacent layer(s).

Figure 6:
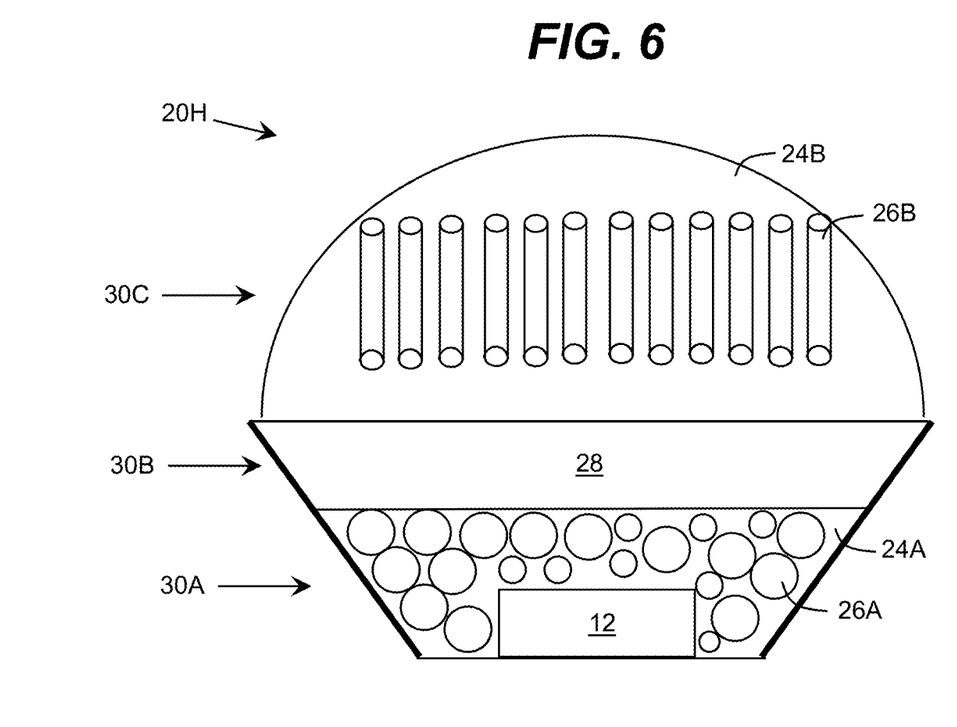
FIG. 6 shows another illustrative encapsulant including a plurality of layers according to an embodiment.

FIG. 6 shows another illustrative encapsulant 20H including a plurality of layers 30A-30C according to an embodiment. The encapsulant 20H can be configured similar to the encapsulant 20G described herein. However, in encapsulant 20H the particles of the second filler material 26B are arranged to form a plurality of photonic crystals within the outer layer 30C of the encapsulant 20G.

Figure 7A:
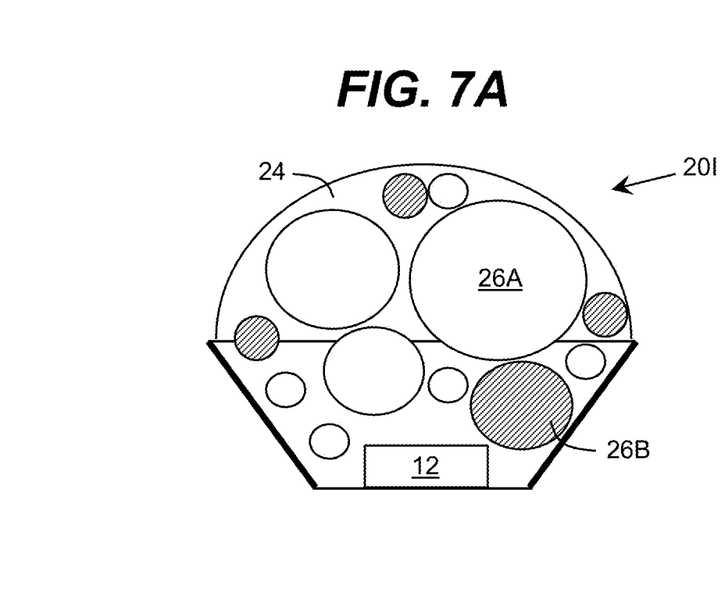
FIGS. 7A and 7B show illustrative encapsulants including multiple types of filler material according to embodiments.
Figure 7B:
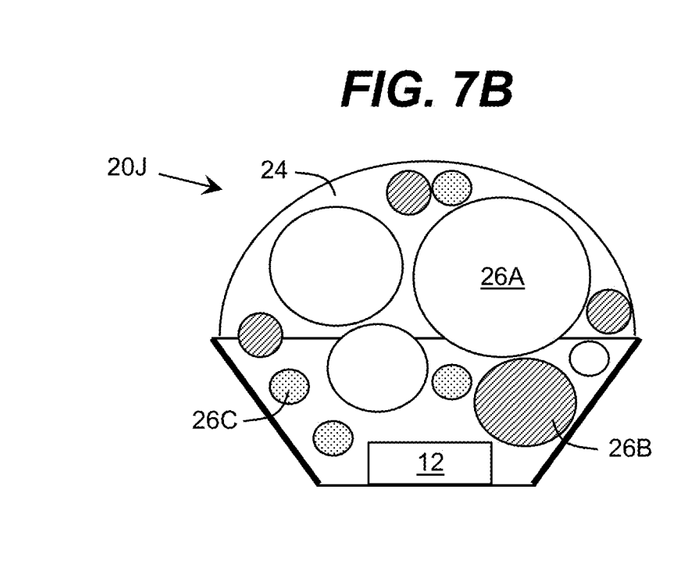

The filler material described herein can include multiple types of materials, each of which is included for a particular purpose. For example, FIGS. 7A and 7B show illustrative encapsulants 20I, 20J, respectively, including multiple types of filler material according to embodiments. Use of multiple types of filler material can enable, for example, finer control of refractive and/or physical properties of the encapsulants 20I, 20J. In particular, the encapsulant 20I is shown including a first type of filler material 26A and a second type of filler material 26B incorporated in a matrix material 24. The two types of filler material 26A, 26B can be included for distinct purposes. For example, the filler material 26A can comprise fluorescent particles, which visibly fluoresce under exposure to ultraviolet radiation of a target wavelength, and the filler material 26B can be included to control a thermal coefficient of expansion of the encapsulant 20I. The fluorescent particles can be selected to identify a wavelength of the ultraviolet radiation.

Similarly, the encapsulant 20J is shown including a first type of filler material 26A, a second type of filler material 26B, and a third type of filler material 26C incorporated in a matrix material 24. The three types of filler material 26A, 26B can be included for distinct purposes. For example, the filler material 26A can be incorporated to control an index of refraction of the encapsulant 20J, the filler material 26B can be included to control a thermal coefficient of expansion of the encapsulant 20J, and the filler material 26C can comprise fluorescent particles.

While two illustrative combinations of filler materials are shown and described herein, it is understood that an encapsulant can comprise any of various combinations of two or more filler materials, which are included for any purpose. For example, an embodiment of the encapsulant 20I can include a combination of two or more filler materials, each of which is selected to allow for better control of both the refractive and the thermal properties of the encapsulant 20I. In still another embodiment, the first filler material 26A can have a first index of refraction and the second filler material 26B can have a second index of refraction, which is higher or lower than the first index of refraction. A concentration of the fillers within the encapsulant 20I can be configured to create a graded index or refraction in the encapsulant 20I, e.g., to provide a gradual transition between an index of refraction at the surface of the ultraviolet device 12 and an index of refraction of the environment surrounding the encapsulant 20I (e.g., ambient).

Figure 8:
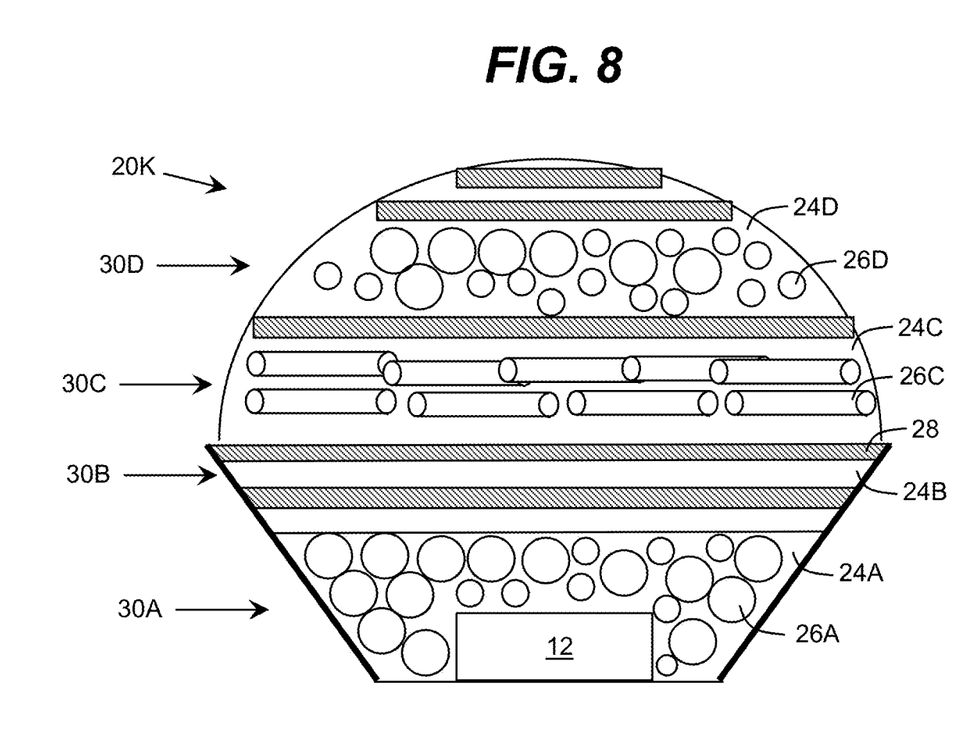
FIG. 8 shows an illustrative encapsulant having a layered structure according to an embodiment.

While the various filler materials in FIGS. 7A and 7B are shown intermingled throughout the matrix material 24, it is understood that embodiments of an encapsulant can comprise two or more layers structures, each with one or more distinct filler materials and/or distinct matrix materials. For example, FIG. 8 shows an illustrative encapsulant 20K having a layered structure according to an embodiment. As illustrated, the encapsulant 20K includes a plurality of layers 30A-30D. One or more of the layers 30A-30D can be formed of a composite material described herein. For example, the layer 30A is formed of a composite material including a matrix material 24A and a filler material 26A, the layer 30C is formed of a composite material including a matrix material 24C and a filler material 26C, and the layer 30D is formed of a composite material including a matrix material 24D and a filler material 26D. However, one or more of the layers, such as the layer 30B can comprise a unitary layer of material, such as a matrix material 24B, which can include a bonding material, but not include any filler material.

In any event, the various layers 30A-30D can be bonded together by a thin layer of a bonding material 28. In an embodiment, the bonding material 28 is a composite material, such as a composite material described herein. To this extent, similar to the layers 30A, 30C, and 30D, the bonding material can be formed of a matrix material and one or more types of a filler material.

Figure 9:
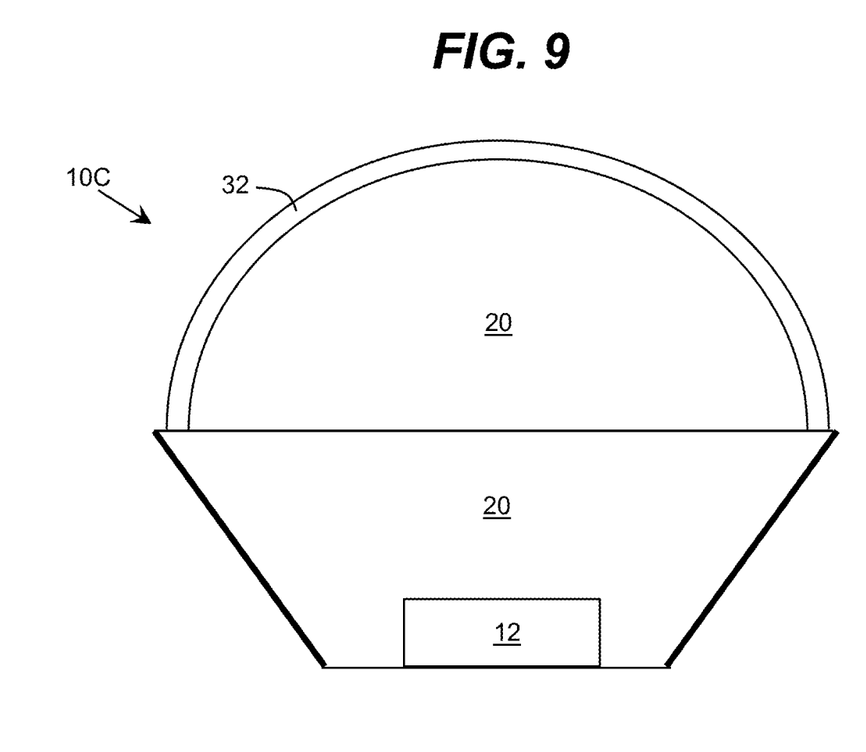
FIG. 9 shows an illustrative device including an anti-reflective coating according to an embodiment.

It is understood that a device including an encapsulant described herein can include one or more additional features to enhance the propagation of ultraviolet radiation through the encapsulant. For example, FIG. 9 shows an illustrative device 100 including an anti-reflective coating 32 according to an embodiment. The device 100 can include an encapsulant 20 comprising a composite material configured as described herein. The anti-reflective coating 32 can be placed on the outer surface of the encapsulant 20 and can provide a transition between the encapsulant 20 and the surrounding environment. In an embodiment, the anti-reflecting coating 32 comprises a material having a refraction index between a refraction index of the encapsulant 20 and a refraction index of ambient and a thickness selected based on the wavelength of the ultraviolet radiation. In an embodiment, the anti-reflective coating 32 comprises a thickness of approximately a quarter of a wave of the ultraviolet radiation. An index of refraction of the anti-reflective coating 32 material can be smaller than an index of refraction of the composite material or one or more components thereof (e.g., matrix material, filler material, and/or the like). For example, an index of refraction of the anti-reflective coating 32 can be approximately equal to a square root of the index of refraction of the composite material. Illustrative materials for the anti-reflective coating 32 include magnesium fluoride, fluoropolymers, and/or the like.

While shown and described herein as a method of designing and/or fabricating a device package, and particularly a device package for an ultraviolet device, it is understood that aspects of the invention further provide various alternative embodiments. For example, in one embodiment, the invention provides a method of designing and/or fabricating a circuit that includes one or more devices incorporating a device package designed and fabricated as described herein.

Figure 10:
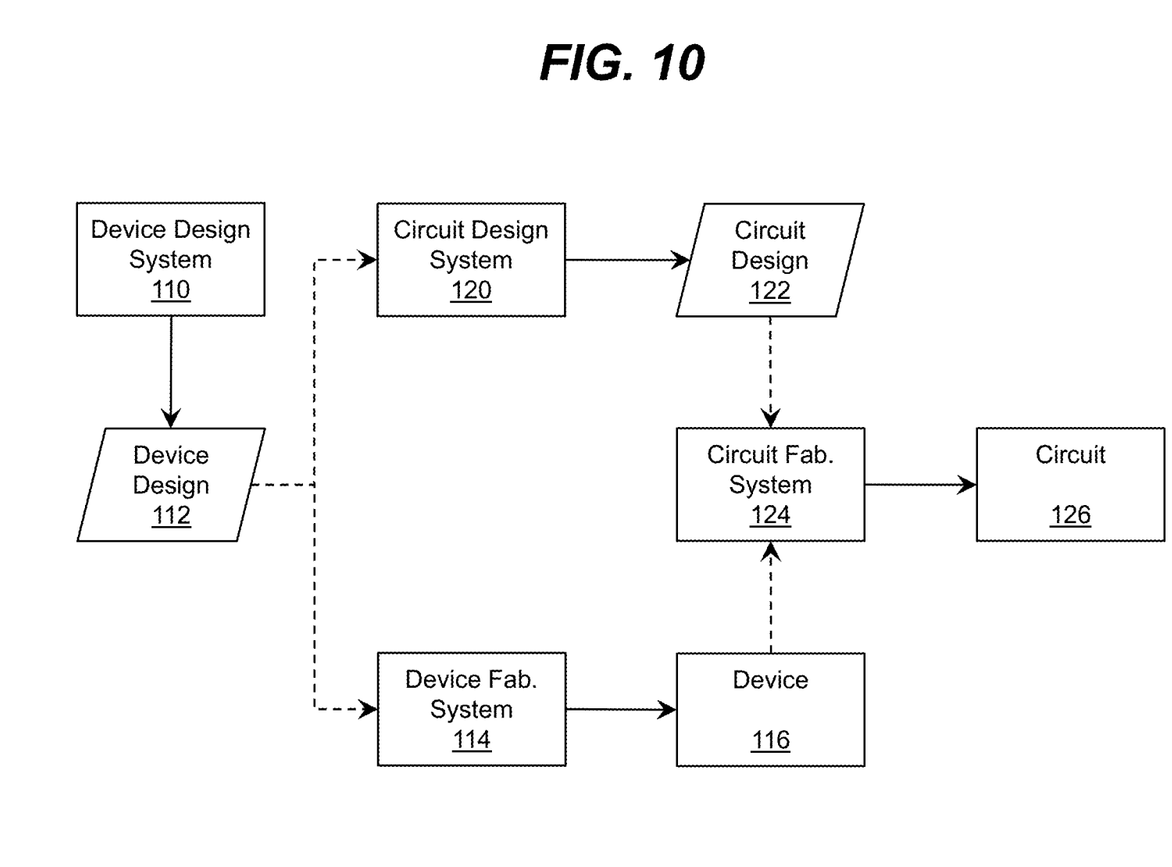
FIG. 10 shows an illustrative flow diagram for fabricating a circuit according to an embodiment.

To this extent, FIG. 10 shows an illustrative flow diagram for fabricating a circuit 126 according to an embodiment. Initially, a user can utilize a device design system 110 to generate a device design 112 for a device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a device 116 as described herein. In this case, the system 110, 114 can comprise a general purpose computing device, which is programmed to implement a method of designing and/or fabricating the device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one device 116 as described herein.

In still another embodiment, the invention provides a computer program fixed in at least one computer-readable medium, which when executed, enables a computer system to implement a method of designing and/or fabricating a device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device package, comprising:
    an ultraviolet device; and
    an encapsulant located adjacent to at least one surface of the ultraviolet device, wherein the encapsulant is a composite material including:
        a matrix material at least partially transparent to ultraviolet radiation of a target wavelength and having a matrix material thermal coefficient of expansion; and
        a filler material at least partially transparent to the ultraviolet radiation incorporated in the matrix material and having a filler material thermal coefficient of expansion significantly smaller than the matrix material thermal coefficient of expansion for relevant atmospheric conditions, wherein the filler material includes a combination of microparticles and nanoparticles.

2. The device package of claim 1, wherein the filler material includes the microparticles interspersed with the nanoparticles.

3. The device package of claim 2, wherein the matrix material is interspersed with the microparticles and the nanoparticles.

4. The device package of claim 1, wherein the filler material further comprises fluorescent particles interspersed with the microparticles and the nanoparticles.

5. The device package of claim 1, wherein a concentration of at least one or both of the microparticles and the nanoparticles in the composite material exceeds a three dimensional percolation threshold for the filler material.

6. The device package of claim 1, wherein the filler material includes the nanoparticles located proximate an entire exterior surface of the encapsulant with at least one microparticle centrally located between the nanoparticles and the ultraviolet device.

7. The device package of claim 1, wherein the microparticles include elongated particles each having a high aspect ratio.

8. The device package of claim 1, wherein the encapsulant comprises a first layer and a second layer, with at least one of the layers including the composite material, and further comprising a transition layer separating the first layer from the second layer, wherein the transition layer includes a bonding material.

9. The device package of claim 8, wherein the transition layer is substantially unoccupied with any of the filler material.

10. The device package of claim 8, wherein only one layer includes the composite material, wherein the layer without the composite material comprises a plurality of photonic crystals.

11. The device package of claim 1, wherein the encapsulant comprises a plurality of layers, with at least one of the layers formed of the composite material.

12. The device package of claim 11, wherein at least one of the layers comprises the matrix material and a filler material that includes one of microparticles and nanoparticles.

13. The device package of claim 11, wherein at least one of the layers comprises the matrix material and a filler material that includes a plurality of photonic crystals.

14. The device package of claim 11, wherein at least one of the layers comprises the matrix material without any filler material.

15. The device package of claim 1, wherein the encapsulant comprises a curved exterior surface opposed from the ultraviolet device, and further comprising an anti-reflecting coating located on the curved exterior surface of the encapsulant, the anti-reflecting coating having a refraction index between a refraction index of the encapsulant and a refraction index of ambient.

16. The device package of claim 1, wherein the relevant atmospheric conditions include a temperature and a pressure present during each of: a curing and a cool down process for fabrication of the device package and normal operation of the ultraviolet device within the device package.

* * * * *